United States Patent
Gurgi et al.

(10) Patent No.: US 9,250,814 B2
(45) Date of Patent: Feb. 2, 2016

(54) COMMAND ORDER RE-SEQUENCING IN NON-VOLATILE MEMORY

(71) Applicant: Apple Inc., Cupertino, CA (US)

(72) Inventors: Eyal Gurgi, Herzeliya (IL); Tomer Ish-Shalom, Herzeliya (IL)

(73) Assignee: Apple Inc., Cupertino, CA (US)

( * ) Notice: Subject to any disclaimer, the term of this patent is extended or adjusted under 35 U.S.C. 154(b) by 114 days.

(21) Appl. No.: 13/763,928

(22) Filed: Feb. 11, 2013

(65) Prior Publication Data

US 2014/0229699 A1 Aug. 14, 2014

(51) Int. Cl.
| | |
|---|---|
| *G06F 13/00* | (2006.01) |
| *G06F 3/06* | (2006.01) |
| *G06F 13/16* | (2006.01) |
| *G11C 16/06* | (2006.01) |

(52) U.S. Cl.
CPC .......... *G06F 3/0611* (2013.01); *G06F 13/1626* (2013.01); *G11C 16/06* (2013.01)

(58) Field of Classification Search
CPC ............ G06F 12/0292; G06F 12/0882; G06F 12/126; G06F 13/124; G06F 13/1626
USPC .............. 711/151, 154, 157; 710/39, 60, 243; 712/8, 225, 245
See application file for complete search history.

(56) References Cited

U.S. PATENT DOCUMENTS

| | | | |
|---|---|---|---|
| 6,564,304 B1 | 5/2003 | Van Hook et al. | |
| 7,127,574 B2 | 10/2006 | Rotithor | |
| 8,316,219 B2 | 11/2012 | Bellows | |
| 2005/0011458 A1 | 1/2005 | Aggarwal | |
| 2005/0091460 A1* | 4/2005 | Rotithor et al. | 711/158 |
| 2005/0114587 A1* | 5/2005 | Chou et al. | 711/103 |
| 2006/0039196 A1* | 2/2006 | Gorobets et al. | 365/185.01 |
| 2008/0291724 A1* | 11/2008 | Litsyn et al. | 365/185.03 |
| 2010/0265764 A1 | 10/2010 | Yoo et al. | |
| 2011/0055531 A1* | 3/2011 | Bellows et al. | 712/245 |
| 2011/0093652 A1* | 4/2011 | Sharon et al. | 711/103 |
| 2011/0276749 A1* | 11/2011 | Litsyn et al. | 711/103 |
| 2013/0117513 A1* | 5/2013 | Brittain et al. | 711/152 |
| 2014/0052936 A1* | 2/2014 | Brittain et al. | 711/151 |

FOREIGN PATENT DOCUMENTS

TW          200733112          9/2007

OTHER PUBLICATIONS

International Search Report and Written Opinion from PCT/US2014/010153, mailed Apr. 10, 2014, pp. 1-11.
"Ozone (O3): An Out-of-Order Flash Memory Controller Architecture", Eyee Hyun Nam et al., IEEE Transactions on Computers, vol. 60, No. 5, May 2011, pp. 653-666.
"Architectures and Optimization Methods of Flash Memory Based Storage Systems", Yuhui Deng, Jipeng Zhou, Journal of Systems Architecture 77, Dec. 30, 2010, pp. 214-227.
Office Action in ROC (Taiwan) Patent Application No. 103101665 issued Apr. 14, 2015.

* cited by examiner

*Primary Examiner* — Reba I Elmore
(74) *Attorney, Agent, or Firm* — Meyertons, Hood, Kivlin, Kowert & Goetzel, P.C.

(57) ABSTRACT

An apparatus includes a memory and storage circuitry. The storage circuitry is configured to receive at least one request causing execution of a sequence of memory commands in the memory, to identify that, although a first memory command appears in the sequence before a second memory command, the execution of the second memory command would improve a performance of the execution of the first memory command, and to execute the second memory command and then to execute the first memory command with the improved execution performance.

17 Claims, 2 Drawing Sheets

COMMAND ORDER RE-SEQUENCING IN NON-VOLATILE MEMORY

FIELD OF THE INVENTION

The present invention relates generally to data storage, and particularly to methods and systems for executing memory commands.

BACKGROUND OF THE INVENTION

In various data storage applications, a host issues a sequence of memory commands for execution in a memory. Various techniques are known in the art for processing sequences of memory commands. Some techniques improve performance by modifying the order in which the commands are executed.

For example, U.S. Patent Application Publication 2009/0172263, whose disclosure is incorporated herein by reference, describes a storage controller connected to a Flash memory module. An execute loop in the storage controller is used to carry out tasks related to reading or writing data from the module. The loop includes reading a data structure from a queue and carrying out a task specified by the data structure, unless resources required by the task are not available, in which event the loop moves on to another data structure stored in another queue. Data structures bypassed by the loop are periodically revisited, until all tasks required are completed. Data structures store state information that is updated when tasks are completed.

SUMMARY OF THE INVENTION

An embodiment of the present invention that is described herein provides a method including, in a memory controller that controls a memory, receiving at least one request causing execution of a sequence of memory commands in the memory. An identification is made that, although a first memory command appears in the sequence before a second memory command, the execution of the second memory command would improve a performance of the execution of the first memory command. The second memory command is executed, and then the first memory command is executed with the improved execution performance.

In some embodiments, the first and second memory commands include read commands, and the performance includes a latency of the execution of the first memory command.

In some embodiments, identifying that the execution of the second memory command would improve the performance of the first memory command includes identifying that the second memory command reads a lower page from a second group of memory cells and that the first memory command reads an upper page from a first group of memory cells. In an embodiment, the first group equals the second group. In a disclosed embodiment, executing the second memory command includes caching the read lower page, and executing the first memory command includes reading the upper page using the cached lower page.

In another embodiment, executing the second memory command includes reading the memory cells in the second group using one or more second read thresholds, and executing the first memory command includes calculating one or more first read thresholds based on the second read thresholds, and reading the memory cells in the first group using the first read thresholds.

In yet another embodiment, executing the second memory command includes caching the read lower page, and executing the first memory command includes calculating one or more first read thresholds based on the cached lower page, and reading the memory cells in the first group using the first read thresholds. In still another embodiment, executing the second memory command includes assessing a condition of the memory cells, and executing the first memory command includes reading the memory cells in the first group based on the assessed condition.

In another embodiment, executing the second memory command and then the first memory command includes, for a given memory block of the memory, executing at least a predefined number of lower-page read commands in the sequence before executing any upper-page read command in the sequence. In an example embodiment, executing the second memory command includes estimating an interference in the second group, and executing the first memory command includes reading the memory cells in the first group based on the estimated interference.

In some embodiments, identifying that the execution of the second memory command would improve the performance of the first memory command includes identifying that the second memory command reads one or more pages having a reduced level of interference. In an example embodiment, executing the second memory command includes learning a characteristic of the interference from the pages read by the second memory command, and executing the first memory command includes canceling the interference in at least one page read by the first memory command using the learned characteristic of the interference.

In another embodiment, identifying that the second memory command reads one or more pages having a reduced interference level includes identifying that the second memory command reads one or more last pages in a memory block. In yet another embodiment, execution of the memory commands is performed by circuitry coupled to the memory, identification of the pages having the reduced level of interference is performed in a memory controller, and the method includes sending an instruction from the memory controller to the circuitry to retain the read pages having the reduced level of interference for future use in canceling the interference.

In another embodiment, the first and second memory commands include respective first and second read commands, and identifying that the execution of the second memory command would improve the performance of the first memory command includes identifying that the second read command is expected to be decoded with fewer errors than the first read command.

There is additionally provided, in accordance with an embodiment of the present invention, apparatus including an interface and storage circuitry. The interface is configured to communicate with a memory. The storage circuitry is configured to receive at least one request causing execution of a sequence of memory commands in the memory, to identify that, although a first memory command appears in the sequence before a second memory command, the execution of the second memory command would improve a performance of the execution of the first memory command, and to execute the second memory command and then to execute the first memory command with the improved execution performance.

There is also provided, in accordance with an embodiment of the present invention, apparatus including a memory and storage circuitry. The storage circuitry is configured to receive at least one request causing execution of a sequence of memory commands in the memory, to identify that, although a first memory command appears in the sequence before a second memory command, the execution of the second memory command would improve a performance of the execution of the first memory command, and to execute the second memory command and then to execute the first memory command with the improved execution performance.

The present invention will be more fully understood from the following detailed description of the embodiments thereof, taken together with the drawings in which:

DETAILED DESCRIPTION OF EMBODIMENTS

Overview

Figure 1:
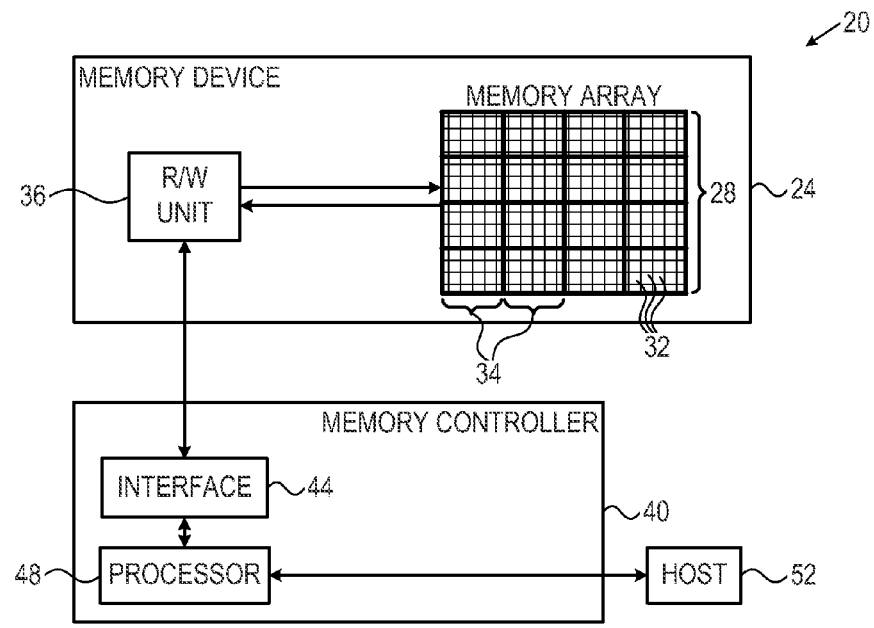
FIG. 1 is a block diagram that schematically illustrates a memory system, in accordance with an embodiment of the present invention.

In a typical storage system, a memory controller stores and retrieves data in a memory on behalf of a host. Some storage protocols permit out-of-order execution of host commands, thereby providing greater freedom and flexibility to the memory controller in optimizing and parallelizing its operation.

Embodiments of the present invention that are described herein provide improved methods and systems for executing sequences of memory commands, such as read and write commands. Although the embodiments described herein refer mainly to non-volatile memory systems, such as Flash-based storage devices, the disclosed techniques are applicable to various other types of memory.

In some embodiments, the memory controller receives a request or requests from the host to store and/or retrieve certain data. The request or requests thus correspond to a sequence of memory commands (e.g., read and write commands) to be executed by the memory controller in the memory.

The memory commands in the sequence appear in a certain order. In some cases, however, executing the memory commands in a different order would reduce latency or otherwise improve performance. In some embodiments that are described herein, the memory controller identifies such cases and modifies the order of execution of the memory commands accordingly.

In particular, the memory controller identifies situations in which a first memory command appears before a second memory command in the sequence, but executing the second command before the first command would improve the execution performance of the first command. Upon detecting a situation of this sort, the memory controller executes the sequence of memory commands out-of-order, such that the second command is indeed executed before the first command. The first and second commands in question are not necessarily successive in the sequence. In other words, the memory controller may change the execution order so as to improve the execution performance of a command that appears at some later stage in the sequence.

Consider, for example, a Multi-Level Cell (MLC) Flash memory in which each group of memory cells stores at least a lower page and an upper page (often referred to as Least Significant Bit (LSB) and Most Significant Bit (MSB) pages, respectively). Typically, it is considerably more efficient to read the LSB page before the MSB page from a given group of memory cells: MSB readout usually requires knowledge of the LSB data, and therefore reading the LSB page first eliminates a superfluous read operation. Moreover, it is sometimes possible to infer the read thresholds for the MSB readout from the LSB read thresholds, which are considerably faster to determine.

Thus, in some embodiments the memory controller identifies that an MSB read command appears in the sequence before an LSB read command from the same group of memory cells. The memory controller then executes the LSB read command before the MSB read command. As a result, execution of the MSB read command is considerably faster.

In alternative embodiments, the memory controller modifies the execution order so as to execute an LSB read command before an MSB read command even if the commands do not address the same group of memory cells. Various other relations between the group of cells holding the LSB page and the group of cells holding the MSB page can be used for obtaining information from the LSB readout and using it in the MSB readout. Consider, for example, a set of physical memory blocks that are defined as a super-block. Readout of any LSB page in the super-block can be used for estimating the retention conditions of the super-block. The retention information can be used to improve the readout of any MSB page in the super-block, whether in the same physical block as the LSB page or in a different physical block.

As another example, the sequence of memory commands may comprise multiple MSB read commands and multiple LSB read commands from a given memory block, arranged in some order. In some embodiments, the memory controller modifies the execution order such that at least a certain number of LSB read commands are executed before any of the MSB read commands. In a particular embodiment, the memory controller executes all the LSB read commands for the given memory block, and then executes the MSB read commands. Modifying the execution order in this manner enables the memory controller to estimate the condition of the memory block (e.g., endurance, retention, read thresholds or other condition) based on the LSB pages, and then use this information to reduce the latency of the MSB read commands.

In other embodiments, the memory controller identifies in the sequence one or more read commands that read one or more last pages in a given memory block, and executes these read commands before other read commands from the block. The last pages in the block typically contain little or no Back-Pattern Dependency (BPD) distortion and other interference. As such, reading these pages is useful in learning the interference characteristics and utilizing this information for improving the readout of other pages from the block.

In summary, the disclosed techniques improve the execution performance of one memory command, by first executing another memory command that originally appeared later in the sequence. As a result, performance measures such as latency and interference cancellation quality can be improved.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for out-of-order execution of memory commands. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Efficient Out-of-Order Execution of Memory Commands

Figure 2:
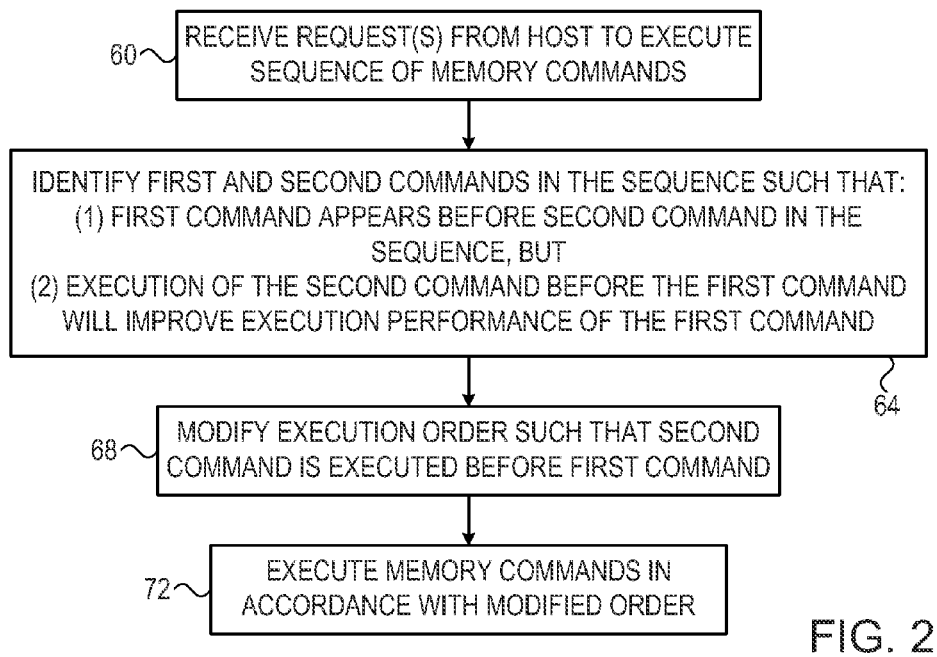
FIGS. 2-4 are flow charts that schematically illustrate methods for executing sequences of memory commands, in accordance with embodiments of the present invention.

FIG. 2 is a flow chart that schematically illustrates a method for executing a sequence of memory commands, in accordance with an embodiment of the present invention. The method begins with memory controller 40 receiving a request or requests from host 52 to store and/or retrieve certain data in memory device 24, at a request reception step 60. The request or requests causes execution of a sequence of memory commands by memory controller 40 in memory device 24.

Processor 48 in memory controller 40 identifies a scenario that warrants modifying the execution order of the command sequence, at a reordering identification step 64. In particular, processor 48 identifies that a first memory command appears before a second memory command in the sequence, but that executing the second command before the first command would improve the execution performance of the first command.

In a reordering step 68, processor 48 modifies the execution order so as to execute the second command before the first command. In an execution step 72, processor 48 executes the memory commands in accordance with the modified order, and in particular executes the second command before the first command. The first command is thus executed with the improved performance.

The description that follows gives several example embodiments that demonstrate such out-of-order command execution. In alternative embodiments, however, the storage circuitry in system 20 may modify the command execution order in any other suitable way.

For example, although the disclosed embodiments refer mainly to read commands, the disclosed techniques can also be used with write commands, as well as in mixed sequences that comprise both read and write commands. For example, since write commands typically comprise verification operations that sense the memory cells, write commands can also serve as a source of information that is useful for improving the performance of other read or write commands.

Figure 3:
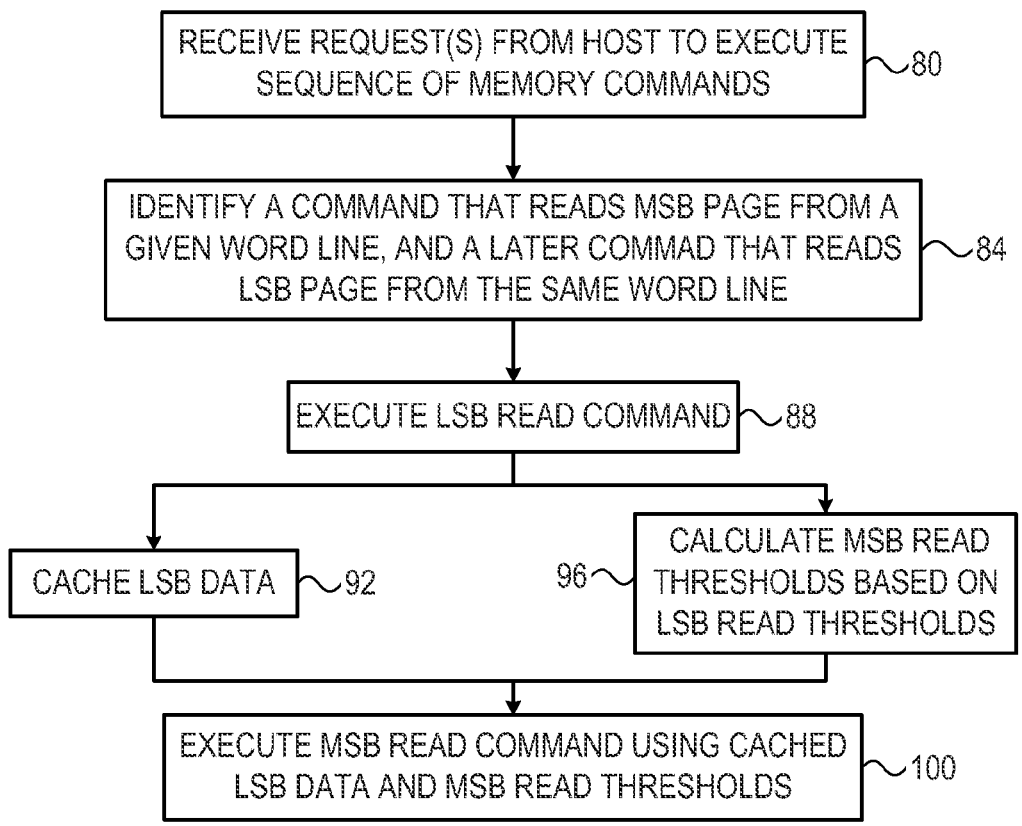

FIG. 3 is a flow chart that schematically illustrates a method for executing a sequence of memory commands, in accordance with an embodiment of the present invention. In the present example, memory cells 32 comprise Multi-Level Cells (MLC), each storing two or more bits of data. Thus, each group of cells 32 (e.g., the cells along each word line) holds at least a lower page and an upper page in respective bits of the cells. The lower and upper pages are often referred to as Least Significant Bit (LSB) and Most Significant Bit (MSB) pages, respectively.

Note that is some embodiments the memory holds more than two pages per cell group, e.g., in three-bit-per-cell MLC memory that holds three pages per cell group. The terms "lower page" and "upper page" (or "LSB page" and "MSB page") refer to any pair of pages selected from the multiple pages stored in a cell group, such that the lower page is stored in lower-significance bits than the upper page.

The method begins with memory controller 40 receiving a request or requests from host 52 to store and/or retrieve certain data in memory device 24, at a request input step 80. The request or requests corresponds to a sequence of memory commands to be executed by memory controller 40 in memory device 24.

Typically, it is considerably more efficient to read the LSB page before the MSB page from a given group of memory cells: MSB readout usually requires knowledge of the LSB data, and therefore reading the LSB page first eliminates a superfluous read operation. Moreover, it is sometimes possible to infer the read thresholds for the MSB readout from the LSB read thresholds, which are considerably faster to determine.

Thus, at an identification step 84, processor 48 identifies an MSB read command from a given group of cells, and an LSB read command from the same group of cells that appears later in the sequence than the MSB read command. Processor 48 first executes the LSB read command, at an LSB execution step 88.

Processor 48 caches the results of the LSB read command, i.e., the LSB page data, at an LSB caching step 92. Caching may be carried out either in the memory controller or in the memory device. Processor 48 calculates the read thresholds for performing the MSB read command, at a threshold calculation step 96. In particular, processor 48 calculates at least one of the read thresholds for the MSB read command based on at least one read threshold used in the LSB read command. Additionally or alternatively, processor 48 calculates at least one of the read thresholds for the MSB read command based on the cached LSB data.

Processor 48 now executes the MSB read command, at an MSB execution step 100. In executing the MSB read command, processor 48 uses the cached LSB page (instead or reading the LSB page again specifically for the MSB read command), and uses the read thresholds that were calculated based on the LSB thresholds. As a result, the MSB read command is simpler to implement and incurs smaller latency. The read LSB and MSB page data is provided to the host, typically together with other readout results of the sequence of memory commands.

Figure 4:
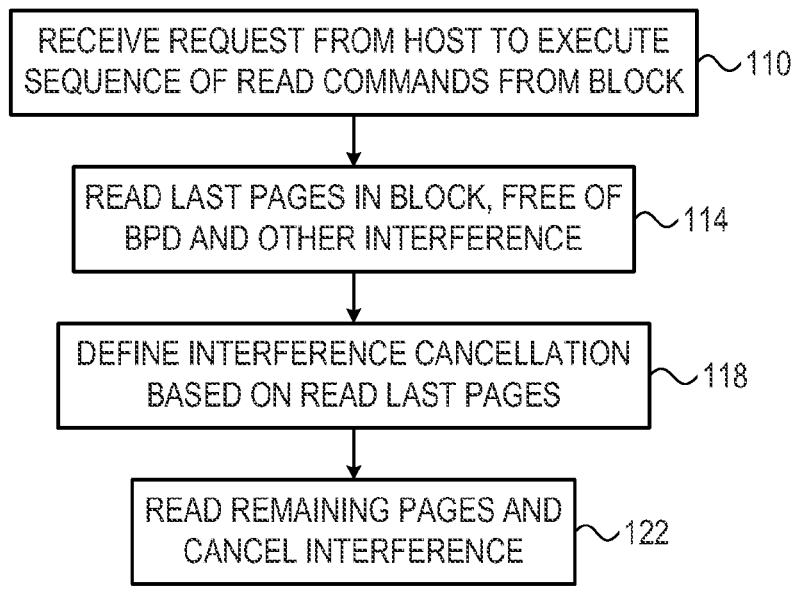

FIG. 4 is a flow chart that schematically illustrates a method for executing a sequence of memory commands, in accordance with an embodiment of the present invention. In the present example, the memory controller identifies read commands that address the (one or more) last pages in a memory block. The last pages in the block typically contain reduced levels of interference relative to other pages. Therefore, these pages can be useful for learning the interference characteristics before reading and canceling interference in the other pages.

For example, if a certain page causes interference to another page, it is beneficial to read the interfering page first, and then read the interfered page using the interference information gained from reading the interfering page. When reading a memory block, it is beneficial to read the last (interference-free but interfering) pages first, and then progress backwards. In this order, the readout of each page provides information regarding the interference in the next pages to be read.

Thus, in some embodiments the memory controller modifies the command execution order so that the last pages of the block are read first.

The method begins with memory controller 40 receiving a request or requests from host 52 to store and/or retrieve certain data in memory device 24, at a request input step 110. The request or requests corresponds to a sequence of memory commands to be executed by memory controller 40 in memory device 24. In particular, the sequence comprises multiple read commands that address respective pages in a given memory block 34.

Processor 48 identifies in the sequence, and reads, one or more pages from the given block that have a reduced interference level, at a reduced-interference readout step 114. In an embodiment, processor 48 identifies and reads one or more read commands that address the last pages in the block, which normally contain little or no Back-Pattern Dependency (BPD) distortion and other interference.

In an interference cancellation definition step 118, processor 48 learns the characteristics of the interference from the pages that were read at step 114 above, and defines an appropriate interference cancellation scheme based on the learned characteristics.

Then, processor 48 executes the remaining read commands in the sequence, addressing other pages from the same block, at a subsequent readout step 122. In executing the remaining read commands, processor 48 cancels the interference using the interference cancellation scheme defined at step 118 above. As a result, interference cancellation quality is improved.

In some embodiments, the sequence does not read the entire block, or otherwise does not address the very last pages in the block. Nevertheless, the highest pages among the pages read from the block can also be used as reduced-interference pages.

The method of FIG. 4 above can be used with any suitable interference cancellation scheme, which may be analog or digital, and which may be applied in the memory controller and/or in the memory device. When implementing interference cancellation in memory device 24, processor 48 in memory controller typically instructs R/W unit 36 in the memory device to retain the reduced-interference page data (or the learned interference characteristics) for future use during interference cancellation in other pages. The interface between memory controller 40 and memory device 24 may support a dedicated command for this purpose.

In some embodiments, processor 48 is aware a-priori that different read commands in the sequence have different expected error probabilities. For example, in some practical cases the error rate increases, on average, with word-line index within a memory block. In other words, readout from the $i^{th}$ word line is expected to have less errors than readout from the $j^{th}$ word line for $i<j$. In another scenario, each word line comprises multiple code words, and it is known to processor 48 that the last code word in each word line (e.g., the fourth code word) has, on average, fewer errors than other code words.

In these embodiments, processor 48 may modify the execution order of the read commands such that read commands that are expected to have fewer errors are executed first. The modified order improves the execution performance of the subsequent read commands, for several reasons.

For example, the first readout operation from the block may require threshold acquisition, i.e., initial estimation of the read thresholds, as opposed to incremental adjustment of the read thresholds. The acquisition process is typically shorter and more reliable with fewer errors. The results of the threshold acquisition can be used for performing the subsequent readout operations that are expected to have more errors. As another example, processor 48 may use the decoding results of lower-error read operations to compute optimal Log Likelihood Ratios (LLRs). These LLRs, or transformations thereof, can be used for reading and decoding subsequent pages that are expected to have more errors.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
in a memory controller that controls a non-volatile memory, receiving at least one request causing execution of a sequence of memory read commands in the non-volatile memory, wherein the non-volatile memory includes a plurality of multi-level memory cells;
identifying a first memory read command of the sequence of memory read commands that appears in the sequence of memory read commands after a second memory read command;
executing the first memory read command, wherein executing the first memory read command includes reading a subset of the plurality of multi-level memory cells using a first plurality of read thresholds to generate first read results, wherein each memory cell of the subset of the plurality of multi-level memory cells is coupled to a common word line;
calculating a second plurality of read thresholds dependent upon the first read results; and
executing the second memory read command, wherein executing the second memory read command includes reading the subset of the plurality of memory cells using the second plurality of read thresholds to generate second read results.

2. The method according to claim 1, further comprising calculating the second plurality of read thresholds dependent upon at least one read threshhold of the first plurality of read thresholds.

3. The method according to claim 1, wherein the first read results corresponds to a Least Significant Bit (LSB).

4. The method according to claim 3, wherein the second read results corresponds to a Most Significant Bit (MSB) page.

5. The method according to claim 4, wherein executing the first memory read command comprises caching the first read results.

6. The method according to claim 3, wherein executing the first memory read command includes assessing a condition of the subset of the plurality of multi-level memory cells, and wherein executing the second memory command includes reading the subset of the plurality of multi-level memory cells based on the assessed condition.

7. The method according to claim 1, wherein identifying the first memory read command includes identifying that the subset of the plurality of multi-level memory cells has a reduced level of interference.

8. The method according to claim 7, further comprising executing the first memory read command by circuitry coupled to the non-volatile memory, and calculating the second plurality of read thresholds by the memory controller.

9. An apparatus, comprising:
an interface, which is configured to communicate with a non-volatile memory; and
storage circuitry configured to:
receive at least one request causing execution of a sequence of memory read commands in the non-volatile memory, wherein the non-volatile memory includes a plurality of multi-level memory cells;
identify a first memory read command of the sequence of memory read commands that appears in the sequence of memory read commands after a second memory read command;
execute the first memory read command;
wherein to execute the first memory read command, the storage circuitry is further configured to read a subset of the plurality of multi-level memory cells using a first plurality of read thresholds to generate first read results, and wherein each memory cell of the subset of the plurality of multi-level memory cells is coupled to a common word line;
calculate a second plurality of read thresholds dependent upon the first read results; and
execute the second memory read commands;
wherein to execute the second memory read command, the storage circuitry is further configured to read the subset of the plurality of multi-level memory cells using the second plurality of read thresholds to generate second read results.

10. The apparatus according to claim 9, wherein the storage circuitry is further configured to calculate the second plurality of read thresholds dependent upon at least one read threshold of the first plurality of read thresholds.

11. The apparatus according to claim 9, wherein the first read results correspond to a Least Significant Bit (LSB) page.

12. The apparatus according to claim 11, wherein the second read results correspond to a Most Significant Bit (MSB) page.

13. The apparatus according to claim 12, wherein to execute the first memory read command, the storage circuitry is further configured to cache the first read results.

14. The apparatus according to claim 11, wherein to execute the first memory read command, the storage circuitry is further configured to assess a condition of the subset of the plurality of multi-level memory cells, and wherein to execute the second memory read command, the storage circuitry is further configured to read the subset of the plurality of multi-level memory cells group based on the assessed condition.

15. The apparatus according to claim 9, wherein to identify the first memory read command, the storage circuitry is further configured to identify that the subset of the plurality of multi-level memory cells has a reduced level of interference.

16. The apparatus according to claim 15, wherein the storage circuitry includes circuitry that is coupled to the memory and is configured to execute the first memory read command, and a memory controller configured to calculate the second plurality of read thresholds.

17. An apparatus, comprising:
a non-volatile memory including a plurality of multi-level memory cells; and
storage circuitry configured to:
receive at least one request causing execution of a sequence of memory read commands in the non-volatile memory;
identify a first memory read command of the sequence of memory read commands that appears in the sequence of memory read commands after a second memory command;
execute the first memory read command;
wherein to execute the first memory read command, the storage circuitry is further configured to read a subset of the plurality of multi-level memory cells using a first plurality of read thresholds to generate first read results, and wherein each memory cell of the subset of the plurality of multi-level memory cells is coupled to a common word line;
calculate a second plurality of read thresholds dependent upon the first read results; and
execute the second memory read commands;
wherein to execute the second memory read command, the storage circuitry is further configured to read the subset of the plurality of multi-level memory cells using the second plurality of read thresholds to generate second read results.

* * * * *